US007042039B2

(12) United States Patent
Mazoyer et al.

(10) Patent No.: US 7,042,039 B2
(45) Date of Patent: May 9, 2006

(54) INTEGRATED MEMORY CIRCUIT FOR STORING A BINARY DATUM IN A MEMORY CELL

(75) Inventors: Pascale Mazoyer, Domene (FR); Alexandre Villaret, Grenoble (FR); Thomas Skotnicki, Crolles Montfort (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/702,066

(22) Filed: Nov. 5, 2003

(65) Prior Publication Data

US 2004/0150024 A1 Aug. 5, 2004

(30) Foreign Application Priority Data

Nov. 5, 2002 (FR) .................................... 02 13838

(51) Int. Cl.
*H01L 27/108* (2006.01)
(52) U.S. Cl. ........................................ 257/298; 257/315
(58) Field of Classification Search ................ 257/298, 257/315, 17, 10, 22, 64, 65, 87
See application file for complete search history.

(56) References Cited

U.S. PATENT DOCUMENTS

| 5,633,178 A | 5/1997 | Kalnitsky |
| 5,830,575 A | 11/1998 | Warren et al. |
| 5,937,295 A | 8/1999 | Chen et al. |
| 6,090,666 A | 7/2000 | Ueda et al. |
| 6,128,243 A | 10/2000 | Chan et al. |
| 6,285,055 B1 * | 9/2001 | Gosain et al. ............... 257/317 |
| 6,330,184 B1 | 12/2001 | White et al. |
| 6,441,392 B1 * | 8/2002 | Gautier et al. ................ 257/12 |
| 6,567,292 B1 * | 5/2003 | King ........................... 365/71 |
| 6,724,038 B1 * | 4/2004 | Mikolajick ................... 257/324 |

FOREIGN PATENT DOCUMENTS

| EP | 1168456 | 1/2002 |
| WO | WO 98/50958 | 11/1998 |

OTHER PUBLICATIONS

De Blauwe, Jan. "Nanocrystal Nonvolatile Memory Device", IEEE Transactions on Nanotechnology, vol. 1, No. 1, Mar. 2002, pp. 72-77, XP008018706.
French Preliminary Search Report dated Jun. 25, 2003 for French Appl. No. 0213838.

* cited by examiner

*Primary Examiner*—David Nelms
*Assistant Examiner*—Thinh T Nguyen
(74) *Attorney, Agent, or Firm*—Lisa K. Jorgenson; Jose Gutman; Fleit, Kain, Gibbons, Gutman, Bongini & Bianco P.L.

(57) ABSTRACT

An integrated memory circuit includes at least one memory cell formed by a single transistor whose gate (GR) has a lower face insulated from a channel region by an insulation layer containing a succession of potential wells, which are substantially arranged at a distance from the gate and from the channel region in a plane substantially parallel to the lower face of the gate. The potential wells are capable of containing an electric charge which is confined in the plane and can be controlled to move in the plane towards a first confinement region next to the source region or towards a second confinement region next to the drain region so as to define two memory states for the cell.

26 Claims, 7 Drawing Sheets

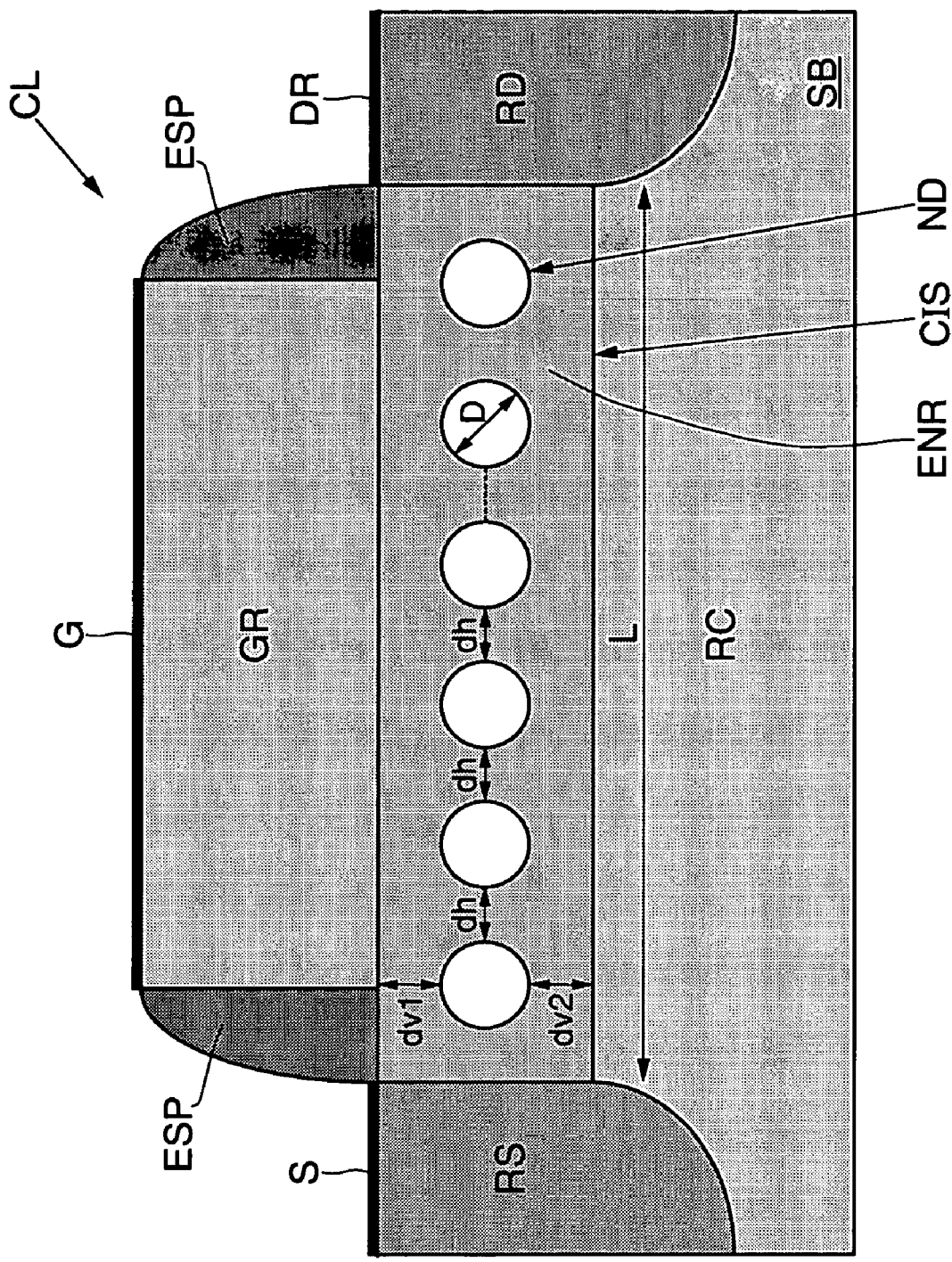

State "0"

State "1"

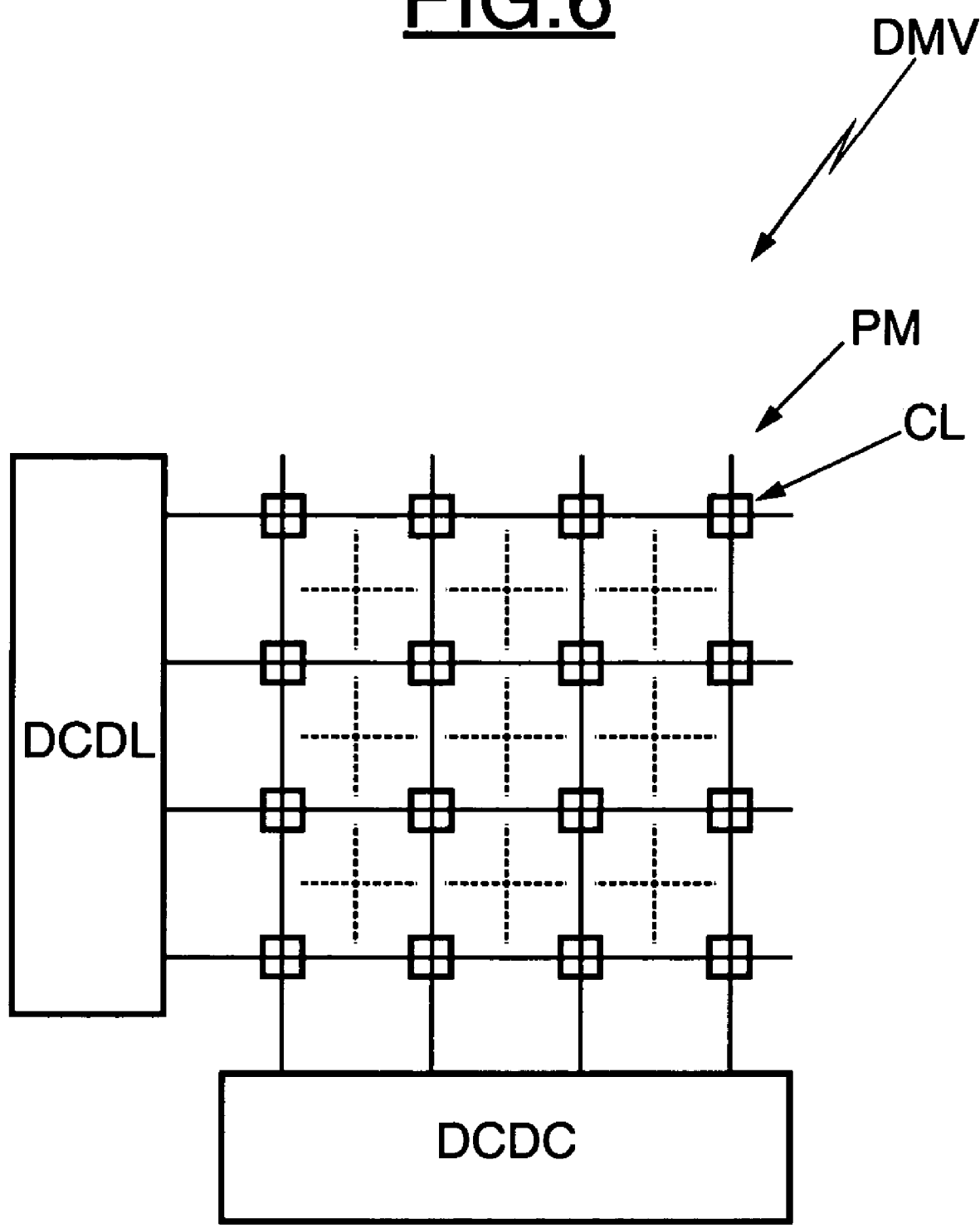

INTEGRATED MEMORY CIRCUIT FOR STORING A BINARY DATUM IN A MEMORY CELL

CROSS-REFERENCE TO RELATED APPLICATION

This application is based upon and claims priority from prior French Patent Application No. 02 13838, filed on Nov. 5, 2002, the entire disclosure of which is herein incorporated by reference.

BACKGROUND OF THE INVENTION

1. Field of the Invention

The present invention relates to memories.

2. Description of the Related Art

At present, distinction is essentially made between three types of industrial memory-effect devices integrated on silicon.

Arrays of the DRAM type, that is to say dynamic random access memories, make it possible to read and write individually from and to each of the elementary cells of which they are made up. These dynamic random access memory cells are compact since they are formed by one transistor and one capacitor. They are furthermore quite fast in terms of access time (typically of the order of 40 to 70 nanoseconds) but require frequent refreshing of the information contained in the capacitor of the cell, essentially because of junction leaks of the transistor of the cell.

There are also SRAM arrays, that is to say static random access memory arrays. Static random access memory cells are individually addressable, have short cycle times (access time of from 6 to 70 nanoseconds) and retain the information for as long as they are supplied with power. These memory cells remain handicapped by their low density, however, since a cell is generally made up of 6 transistors.

So-called non-volatile memories are also known (for example so-called "flash" memories) which can retain information for several years inside a floating zone insulated by oxide, and without refreshing or supplying power. These memories are compact since they are formed by a single transistor, but the mechanism of writing by the tunnel effect through the insulation oxide of the floating zone is slow and requires strong biases, with access times that can vary from of the order of a microsecond up to a millisecond. Furthermore, these cells are not individually addressable when erasing.

U.S. Pat. No. 5,633,178 furthermore discloses a non-volatile memory cell formed by a single insulated-gate transistor whose gate oxide contains electron traps, which are arranged in contact with the substrate. The writing of a logical "1" or a logical "0" into the memory cell is carried out by vertical movement of charges so as either to fill the electron traps or to empty them. The localization of electron traps at the interface between the gate dielectric and the substrate is particularly difficult to control from a technological point of view.

U.S. Pat. No. 6,128,243 furthermore discloses a tunnel-junction memory (TJM memory) cell containing crystals of semiconductor material in the gate oxide of the transistor constituting this cell. Such a cell is used as a backup cell to provide a medium for holding the information of an SRAM memory during a possible power cut. Furthermore, the mechanism of storing charges in this prior art cell relies on vertical transfer of the charges from the channel to the crystals. Writing is then carried out with hot electrons or with a tunnel current, and erasing is carried out with a tunnel current.

Accordingly, there exists a need for overcoming the disadvantages of the prior art as discussed above.

SUMMARY OF THE INVENTION

The invention aims to provide a memory structure that is totally different from those existing in the prior art.

The invention aims to provide a memory whose performance is a hybrid between those of conventional flash and DRAM cells, while overcoming their respective limitations. It is hence an object of the invention to provide a memory point that can be addressed when writing and when reading, while offering the compactness of a single transistor. Furthermore these reading and writing modes permit an access time of a few nanoseconds for the information.

The invention therefore provides an integrated memory circuit, comprising at least one memory cell formed by a single transistor whose gate has a lower face insulated from the channel region by an insulation layer containing at least one succession of potential wells, which are substantially arranged at a distance from the gate and from the channel region in a plane substantially parallel to the lower face of the gate. The potential wells are capable of containing an electric charge which is confined in the plane and can be controlled to move in the plane towards a first confinement region next to the source region or towards a second confinement region next to the drain region, so as to define two memory states for the cell.

The charge transfer mechanisms in the cell according to the invention are parallel to the conduction channel. The cell according to the invention therefore differs from the prior art cells described in U.S. Pat. No. 5,633,178 and in U.S. Pat. No. 6,128,243, in which the transfer mechanisms are perpendicular to the conduction channel. Furthermore, the inventive localization of the potential wells at a distance from the substrate is much easier to adjust from a technological point of view than the localization of electron traps in contact with the substrate.

Furthermore, the memory cell according to the invention has a stronger memory effect compared with the memory cell of U.S. Pat. No. 5,633,178, that is to say a longer retention time.

One way of producing the potential wells, which is particularly simple technologically, consists in providing, as the insulation layer, a dielectric encapsulation encapsulating nodules that form the potential wells. These nodules are then capable of carrying the electric charge. In other words, according to this embodiment, use is made of a conventional MOS transistor architecture in which a layer of nodules is interposed between the gate and the channel of the transistor.

In general, the nodules may be formed by a crystalline material whose conduction band has a level lower than the level of the conduction band of the inter-nodule dielectric material.

Here again, several possibilities are available.

The nodules may, for example, have an intrinsic electric charge. This is the case when they are formed for example by a semiconductor material, for example silicon or a silicon alloy.

The nodules may also be free of intrinsic electric charge: this is the case for example when they are formed by an insulating material, for example silicon nitride.

In both of the cases mentioned above, the inter-nodule dielectric material may be silicon dioxide, for example, which is a material that has a particularly high conduction band level in microelectronics.

When the nodules are free of intrinsic electric charge, it is then necessary to inject an electric charge into the dielectric encapsulation so as to populate the nodules. Therefore, injection means are then provided which are capable of injecting the electric charge into the encapsulation so as to charge at least some of the nodules.

This is not essential when the nodule systems are formed by a semiconductor material, since in this case they have an intrinsic electric charge. In certain applications, however, it may be advantageous to use injection means for injecting an additional electric charge into the encapsulation so as to charge at least some of the nodules.

According to one embodiment of the invention, the injection means contain biasing means capable of biasing the gate. This being the case, in order to be able to charge the nodules with an electric charge or an additional electric charge, as appropriate, and since the injection current flows vertically from the substrate towards the gate or from the gate towards the substrate, it is expedient for the quantity of charges arriving at the nodules to be greater in the end than the quantity of charges which have left the nodules. One way of obtaining this result hence consists in providing a thickness of the part of the insulation layer lying between the potential wells and the gate which is different from the thickness of the part of the insulation layer lying between the potential wells and the channel. Naturally, the choice as to which these two parts should be the thicker will be made as a function of the sign of the applied bias and the sign of the injected charges. In practical terms, when the intention is to charge the potential wells with electrons, a positive bias voltage will for example be applied to the electrode that lies on the same side as the thicker dielectric.

According to one embodiment of the invention, the source and drain regions are arranged so as to be in capacitive coupling with the potential wells which lie in the vicinity of the ends of the insulation layer. Biasing means are then advantageously provided which are capable of biasing the source and drain regions of the transistor so as to move the electric charge towards the first confinement region or towards the second confinement region.

One way of causing the electric charge, that is to say the memory charge, to be confined in the plane of the nodules but capable of being moved in this plane by virtue of the drain-source biases, consists in arranging for the average space between two nodules to be less than the average diameter of the nodules, and for this average space between two nodules also to be less than the average distance separating the nodules from the lower face of the gate, as well as less than the average distance separating the nodules from the channel region.

The average space between two nodules fixes the thickness of the electron barrier between two potential wells. It is hence preferable for this average space between two nodules to be large enough so that the electric charge, which is confined in one or other of two confinement regions, does not become distributed over all of the nodules by the tunnel effect. Furthermore, this average space should be small enough to avoid using bias voltages that are excessively large and incompatible with a microelectronic memory application. As an indication, the average space between two nodules may therefore be between about 0.5 and 3 nanometers.

Furthermore, even though the invention is in theory applicable regardless of the length of the channel, the bias voltages to be applied become commensurately greater as the length of the channel is large. The invention is hence particularly beneficial for submicron channel lengths, that is to say channel lengths less than or equal to 100 nanometers, for example a length equal to 50 nanometers. In this case, the bias voltages to be applied are of the order of a few volts and the memory cell according to the invention is then characterized by its very small size, which makes it particularly beneficial in terms of the surface area that it occupies.

Likewise, the memory effect per se is not limited by the thickness of the dielectric encapsulating the potential wells. Nevertheless, increasing this thickness of dielectric entails a reduction of the reading current of the transistor. In practice, the limit on the thickness of the dielectric encapsulation is therefore fixed by the detection threshold of the sense amplifier. At present, a thickness of between about 1 nanometer and about 10 nanometers may be selected for the part of the insulation layer lying between the potential wells and the gate. The same range may also be used for the thickness of the part of the insulation layer lying between the potential wells and the channel.

According to one embodiment of the invention, the memory circuit according to the invention also contains reading means capable of measuring the drain current for a given gate bias. This will make it possible to determine whether the content of the memory is a "1" or a "0".

In order to improve the capacitive coupling between the source and drain regions and the potential wells lying at the ends of the insulation layer, it is particularly advantageous for the source and drain regions to come in contact with the lateral ends of the insulation layer.

According to the invention, the memory circuit according to the invention also contains a memory plane formed by a plurality of memory cells, each memory cell being addressable individually.

The invention also relates to a method for storing a binary datum in a memory cell of an integrated memory circuit, the cell being formed by a single transistor whose gate has a lower face insulated from the channel region by an insulation layer.

According to a general characteristic of the invention, an electric charge is confined inside the insulation layer, at a distance from the gate and from the channel region, in at least one plane substantially parallel to the lower face of the gate, and the electric charge is controlled to move in the plane towards a first confinement region next to the source region or towards a second confinement region next to the drain region, so as to define two memory states for the cell corresponding to the two logical values of the binary datum.

According to one embodiment of the invention, the electric charge is moved in one direction or in the other as a function of the sign of the difference between the drain bias voltage and the source bias voltage.

It is also possible, if so desired, to inject an electric charge into the insulation layer so as to charge at least some of the potential wells.

The electric charge may be injected by biasing the gate, the thickness of the part of the insulation layer lying between the potential wells and the gate then being different from the thickness of the part of the insulation layer lying between the gate and the channel.

The content of the memory cell may be read by measuring the drain current for a given gate bias.

The invention also relates to a method for fabricating an integrated memory circuit, comprising the production of at least one memory cell involving the formation, on a semiconductor substrate, of an insulation layer containing at least one succession of potential wells which are substantially arranged at a distance from the upper surface of this insulation layer and from the upper surface of the substrate, in a plane substantially parallel to the upper face of the substrate, the formation of a gate region on the upper surface of the insulation layer, and the formation of source and drain regions on either side of the gate and in capacitive coupling with the potential wells which lie in the vicinity of the ends of the insulation layer.

According to one embodiment, the formation of the insulation layer involves the formation of a dielectric encapsulation encapsulating nodules that form the potential wells.

The formation of the encapsulation and of the nodules involves, for example, the formation of a lower dielectric layer on the upper surface of the substrate, the formation of nodules on the lower dielectric layer, and the formation of an upper dielectric layer encapsulating and covering the nodules.

The formation of the nodules may involve nodular deposition of a crystalline material whose conduction band has a level lower than the level of the conduction band of the inter-nodule dielectric material.

According to one embodiment, the formation of the gate involves the deposition of a layer of gate material on the insulation layer, etching of the layer of gate material with the etch-stop on the insulation layer, and the formation of insulating spacers on the sidewalls of the gate.

Furthermore, the formation of the source and drain regions involves etching of the insulation layer on either side of the spacers and epitaxy such that the source and drain regions come in contact with the ends of the insulation layer.

BRIEF DESCRIPTION OF THE DRAWING

Other advantages and characteristics of the invention will become apparent on studying the detailed description of embodiments, which do not imply any limitation, and the appended drawings, in which:

FIG. 1 schematically illustrates a memory cell according to a preferred embodiment of the present invention;

FIG. 6 schematically illustrates an integrated memory circuit according to the invention.

DESCRIPTION OF THE PREFERRED EMBODIMENTS

In FIG. 1, the reference CL denotes a memory cell according to the invention. This memory cell is formed by a transistor whose gate GR is insulated from the channel region RC lying in a semiconductor substrate SB, for example made of silicon, by an insulation layer CIS inside which nodules ND are embedded.

Here, the nodules form a succession of potential wells. Although these nodules may be formed by any crystalline material susceptible of nodular deposition, for which the level of the conduction band is lower than the level of the conduction band of the dielectric encapsulation ENR, which is arranged between the nodules and encapsulates them, nodules made of silicon or a silicon alloy (for example silicon-germanium) may for example be selected. The dielectric encapsulation ENR may then, for example, be silicon dioxide.

These nodules are arranged in a plane substantially parallel to the lower face of the gate GR, as well as to the upper face of the substrate SB.

Furthermore, these nodules lie at a distance from these two faces.

More precisely, in FIG. 1, the reference dv1 denotes the distance separating the nodules from the lower face of the gate GR, and the reference dv2 denotes the distance separating the nodules from the upper face of the substrate SB, that is to say from the channel region RC.

Although regularly spaced nodules have been represented in FIG. 1, the distribution of the nodules in the plane results, in practice, from an operation of nodular deposition of a crystalline material. Depending on the type of nodular deposition that is used, it is not inconceivable for some of the nodules to be closer together than others, or even to touch one another. This being the case, the reference dh in FIG. 1 denotes the average distance between two nodules. Likewise, the reference D denotes the average diameter of a nodule.

In FIG. 1, the source RS and drain RD regions are in contact with the lateral ends of the insulation layer CIS. As will be seen in more detail below, these source and drain regions here provide coupling with the nodules lying in the vicinity of the ends of the insulation region CIS.

It will be noted therefore that in this embodiment, the insulation layer CIS, that is to say the gate oxide, lies underneath the upper surface of the semiconductor wafer, with only the gate of the transistor protruding from this surface.

Lastly, source S, drain DR and gate G metallizations will make it possible to apply bias voltages, as will be seen in detail below.

As an example, a value equal to 1 nanometer may be selected for dh and a value equal to 5 nanometers may be selected for dv2, and 8 nanometers for dv1. The diameter D may be selected between 3 nanometers and 10 nanometers, for example.

In the example being described here, the length L of the channel RC is taken to be equal, for example, to 50 nanometers.

Figure 2B:
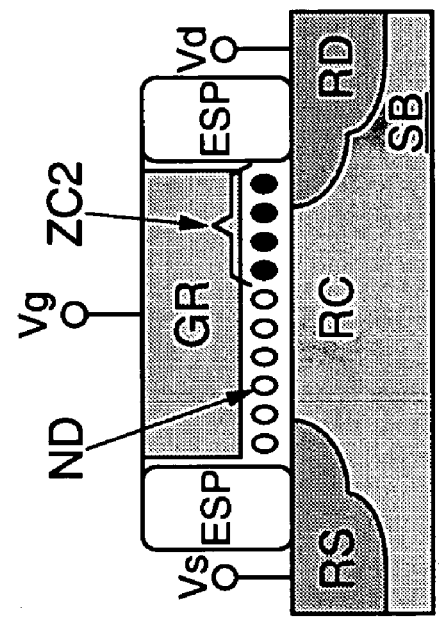
FIGS. 2a and 2b schematically illustrate the two memory states of a memory cell according to the invention.
Figure 2A:
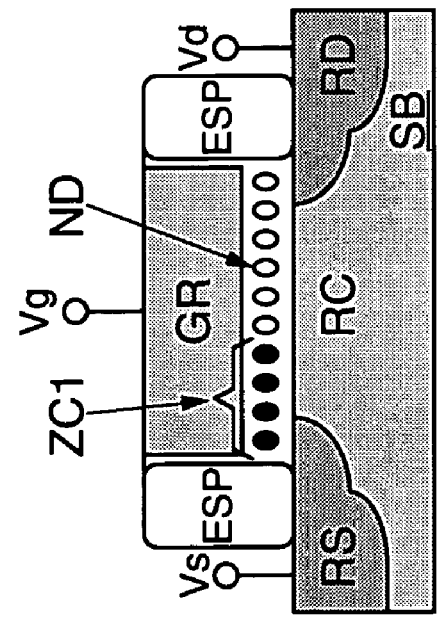
Figure 3:
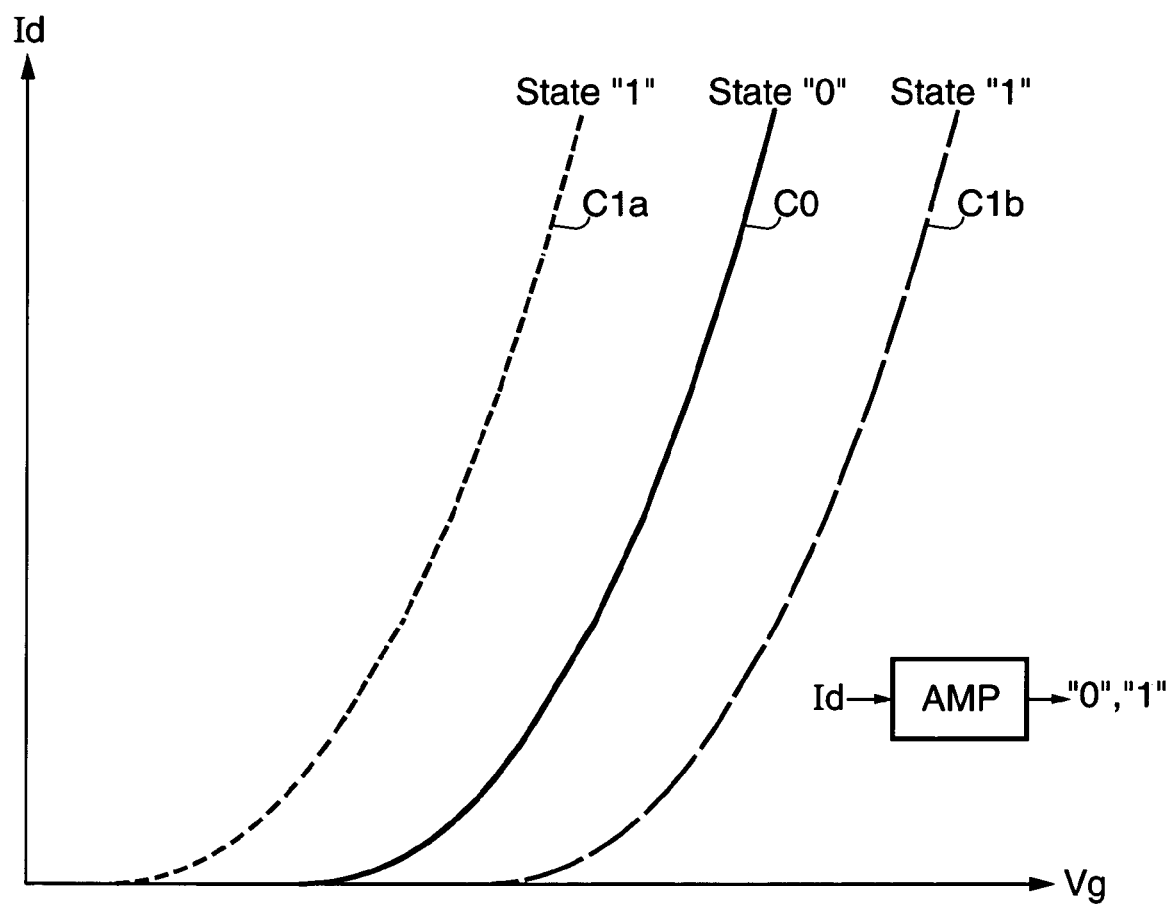
FIG. 3 represents curves relating to the reading of the states of a memory cell according to the invention.

Reference will now be made more particularly to FIGS. 2a, 2b and 3 in order to illustrate a method of operating the memory cell according to the invention.

As indicated above, the nodules constitute a succession of potential wells. The latter make it possible to confine an electronic charge above the conduction channel, either in a first confinement zone ZC1 next to the source region RS (FIG. 2a) or in a second confinement zone ZC2 next to the drain region RD (FIG. 2b).

The confinement of the electronic charges carried by the nodules in one or other of these two zones therefore defines two memory states for the cell, corresponding to two logical values "1" and "0" of a binary datum intended to be stored in this memory cell. It is possible, as in the example being illustrated, to define that the state "1" corresponds to confinement of the charges in the zone ZC1, whereas the state "0" corresponds to confinement of the charges in the zone ZC2.

The biasing of the source and drain regions makes it possible to transfer the electronic charges, for example electrons, from one nodule to another, either towards the zone ZC1 or towards the zone ZC2 as a function of the sign of the voltage difference Vd−Vs. As an example, if the transistor of the memory cell is a transistor of the NMOS type with the source earthed, a negative bias voltage Vd on the drain will hence make it possible to confine the charges in the zone ZC1, whereas a positive drain voltage will make it possible to confine the charges in the zone ZC2.

When the bias is removed, the electric charge remains confined on the side to which it has been transferred.

For writing, the bias of the gate is arbitrary given that the movement of the charges takes place parallel to the gate and to the channel. This being the case, this bias can make it possible to reduce the strength of the drain-source current and consequently the power consumption of the memory cell.

In the example described with reference to FIGS. 2a and 2b, it will have been noted that the source and drain regions consist here of zones diffused into the substrate, and are not in contact with the lateral ends of the insulation layer. The capacitive coupling takes place by means of the source and drain extension zones coming in contact under the ends of the insulation layer CIS. Of course, the operating principle that has just been described with reference to FIGS. 2a and 2b is the same as for the embodiment illustrated in FIG. 1.

When they are made of silicon, the nodules may contain a sufficient number of intrinsic electric charges.

However, if the nodules were to be formed by silicon nitride encapsulated in silicon dioxide, or if the nodules did not contain a sufficient number of intrinsic electric charges when made of silicon, it would then be necessary to inject an electric charge into the encapsulation in order to populate at least some of the nodules, before the writing operation is carried out. This injection is then, for example, carried out by biasing the gate GR with a strong bias voltage Vg, typically of the order of a few volts, for a certain time, for example one second, so as to create a tunnel current originating from the channel. The electrons will then pass through the dielectric encapsulation and progressively accumulate on the nodules. This being the case, other electrons will leave the nodules and go towards the gate GR. If the intention, in the end, is actually to have electric charges on the nodules, it is expedient to provide a dielectric encapsulation that is asymmetric, so that the quantity of charges arriving at the nodules is greater than the quantity of charges departing from them. In the example described here, in which the charges are electrons and in which the gate is biased, a thickness dv1 will thus be selected which is greater than the thickness dv2.

The reading of the content of the memory cell CL consists in measuring the drain current Id for given gate and drain biases. This is illustrated in FIG. 3.

Distinction should be made here between the case in which the charges stored on the nodules are of the same sign as the charges present in the channel or, alternatively, if these stored charges are of opposite sign with respect to the charges in the conduction channel.

Curve C0 represents the variation of the drain current Id with respect to the gate bias Vg for a state "0" of the memory cell, that is to say for the case in which the electric charges have been confined in the zone ZC2 close to the drain.

Curve C1a represents the variation of the drain current with respect to the gate bias voltage in the case in which charges of opposite sign with respect to the charges present in the conduction channel have been confined in the zone ZC1, that is to say close to the source.

Curve C1b illustrates the variation of the drain current Id with respect to the gate bias voltage Vg for the case in which charges of the same sign as the charges present in the conduction channel RC have been stored in the confinement zone ZC1 close to the source.

It can therefore be seen in general that, for a given gate bias, the drain current Id differs between the state "0" and the state "1" of the memory. Furthermore, for a given gate bias, this drain current in the state "1" may be less than or greater than the drain current in the state "0", depending on the sign of the charges which are stored.

Whatever the case, for a given cell, the values of the drain currents for a given gate bias are known in each of the states "0" and "1" of the cell. The reading means will then consist of a sense amplifier (AMP) which will detect the level of the drain current for a given gate bias and for a given drain bias, and which will then deduce therefrom whether this level is a high level or a low level by comparing it with a reference level. The logical content of the memory cell will then be deduced from this.

Figure 4A:
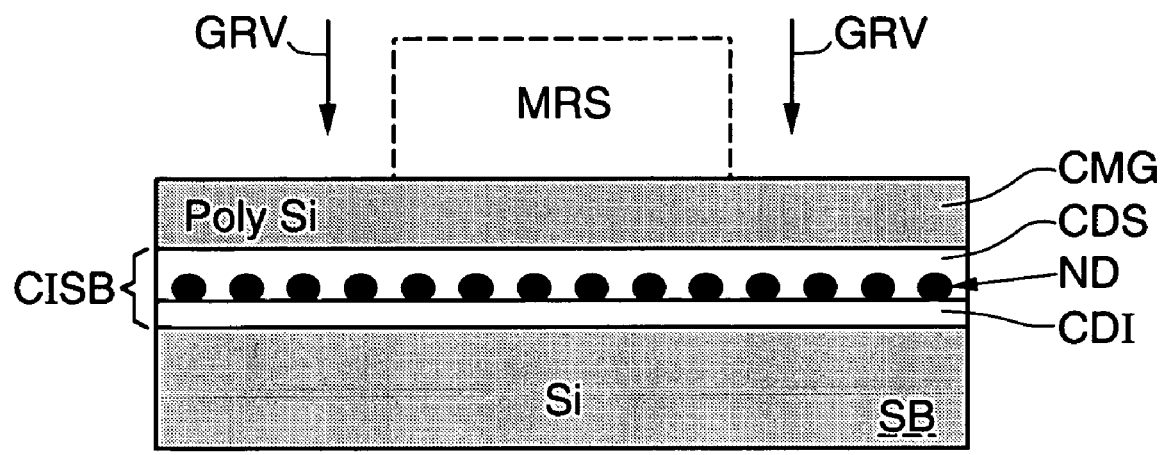
FIGS. 4a and 4b illustrate a first method of fabricating a memory cell according to the invention.
Figure 4B:
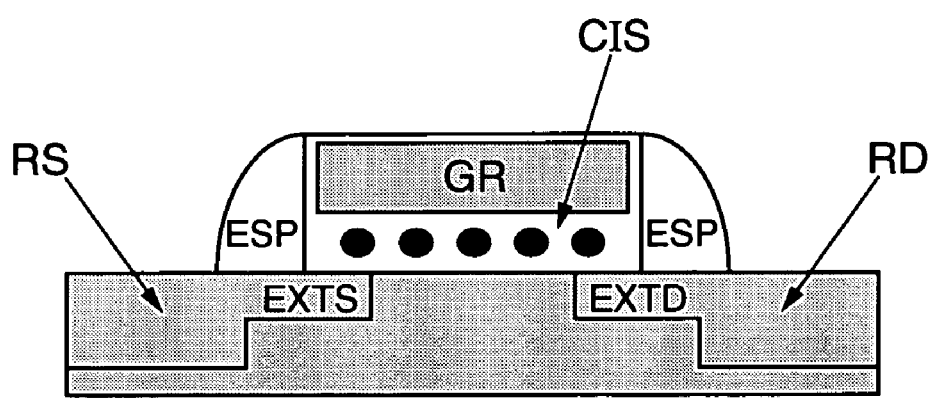

Reference will now be made more particularly to FIGS. 4a and 4b in order to illustrate a first method of fabricating a memory cell according to the invention.

In FIG. 4a, the reference SB denotes a silicon substrate. Thermal oxidation of the substrate SB is carried out in order to form a lower dielectric layer CDI of silicon dioxide. Nodular deposition of silicon is then carried out in order to deposit beads or nodules of silicon ND on the lower dielectric layer CDI. In this regard, the nodular deposition of a material is already conventional and known per se, since it is already used for the fabrication of tunnel-junction memories (TJM memories). Deposition of nodules by an LPCVD (low-pressure chemical vapor deposition) method or by a method known to the person skilled in the art by the term HSG (Hemispherical Silicon Grain) may be mentioned. The person skilled in the art may also refer to the article by Jane D. Bloway entitled "Nanocrystal non-volatile memory devices", IEEE TE Nanotechnology, Vol. 1, No 1, page 72 et sequentia.

In the event that silicon nitride nodules are envisaged, they may be deposited by an LPCVD technique.

The next step consists in a depositing a layer of silicon dioxide CDS on the lower dielectric layer CDI, in a manner which is conventional and known per se, between and on the nodules ND so as encapsulate them and form a layer CISB.

A layer of a gate material CMG, for example polysilicon, is then deposited in a manner that is conventional and known per se. This layer CMG is then etched, by a conventional etching operation GRV, on either side of a resin mask MRS so as to delimit the gate GR of the transistor of the memory cell. The layer CISB is also etched so as to form the insulation layer CIS.

First implantation of dopants in the substrate is then carried out (FIG. 4b) so as to form the extension zones EXTS and EXTD of the source and drain regions. Spacers are subsequently formed on the sidewalls of the gate GR and of the layer CIS, and second implantation of dopants is carried out so as to produce the source and drain regions RS and RD.

A second fabrication method is illustrated in FIGS. 5a to 5d.

The first phases of this fabrication method (FIG. 5a) are similar to those that have just been described with reference to FIG. 4a.

Figure 5A:
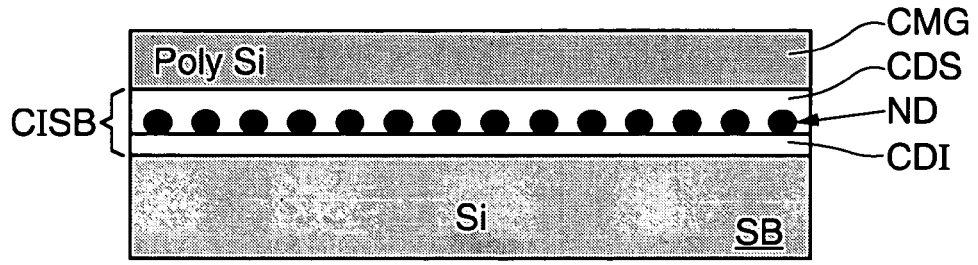
FIGS. 5a to 5d illustrate a second method of fabricating a memory cell according to the invention.
Figure 5B:
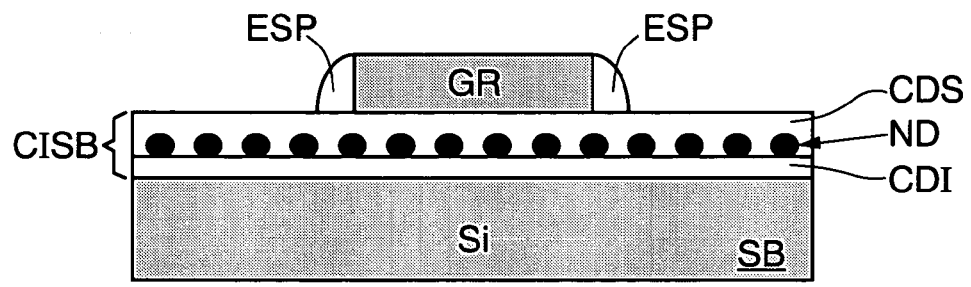

In contrast, as illustrated in FIG. 5a, instead of etching both the layer of gate material CMG and the layer CISB in a self-aligned fashion, only the layer of gate material CMG is etched with the etch-stop on the layer CISB. Spacers are subsequently formed on the sidewalls of the gate GR.

Figure 5C:
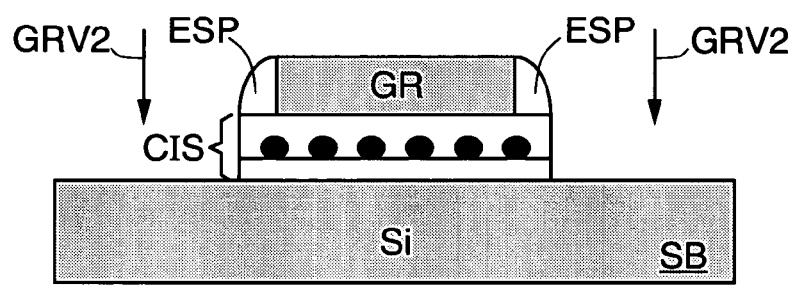

Conventional anisotropic etching GRV2 of the layer CISB is then carried out on either side of the spacers ESP, so as to form the insulation layer CIS (FIG. 5c).

Figure 5D:
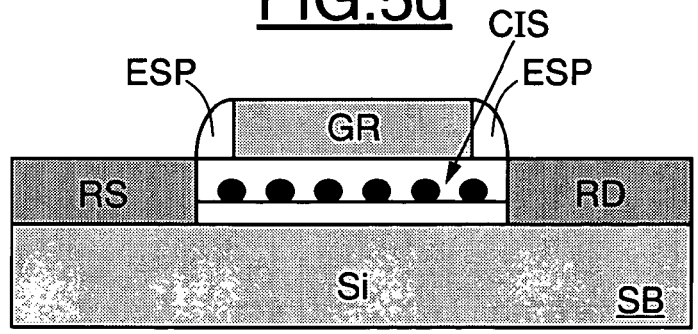

Next, as illustrated in FIG. 5d, silicon epitaxy is repeated on either side of the layer CIS, so as to form the source and drain regions RS and RD which will come in contact with the lateral ends of the layer CIS.

This embodiment has the advantage of greater capacitive coupling between the source and drain regions and the nodules of the layer CIS.

The memory cell according to the invention, which has just been described, may of course be combined as an array with a plurality of other memory cells of the same type, so as to form a memory plane PM as illustrated in FIG. 6. Then, in particular, a row decoder DCDL and a column decoder DCDC are associated with this memory plane in the conventional way, so as to be able to address each memory cell CL of the memory plane individually. The integrated memory circuit DMV then constitutes a memory having properties that are hybrid between those of flash and DRAM memories, while overcoming their respective limitations. In particular, this memory circuit is composed of individually addressable cells while offering the compactness of a single transistor. Furthermore the reading and writing modes permit an access time of a few nanoseconds for the information.

Figure 7:
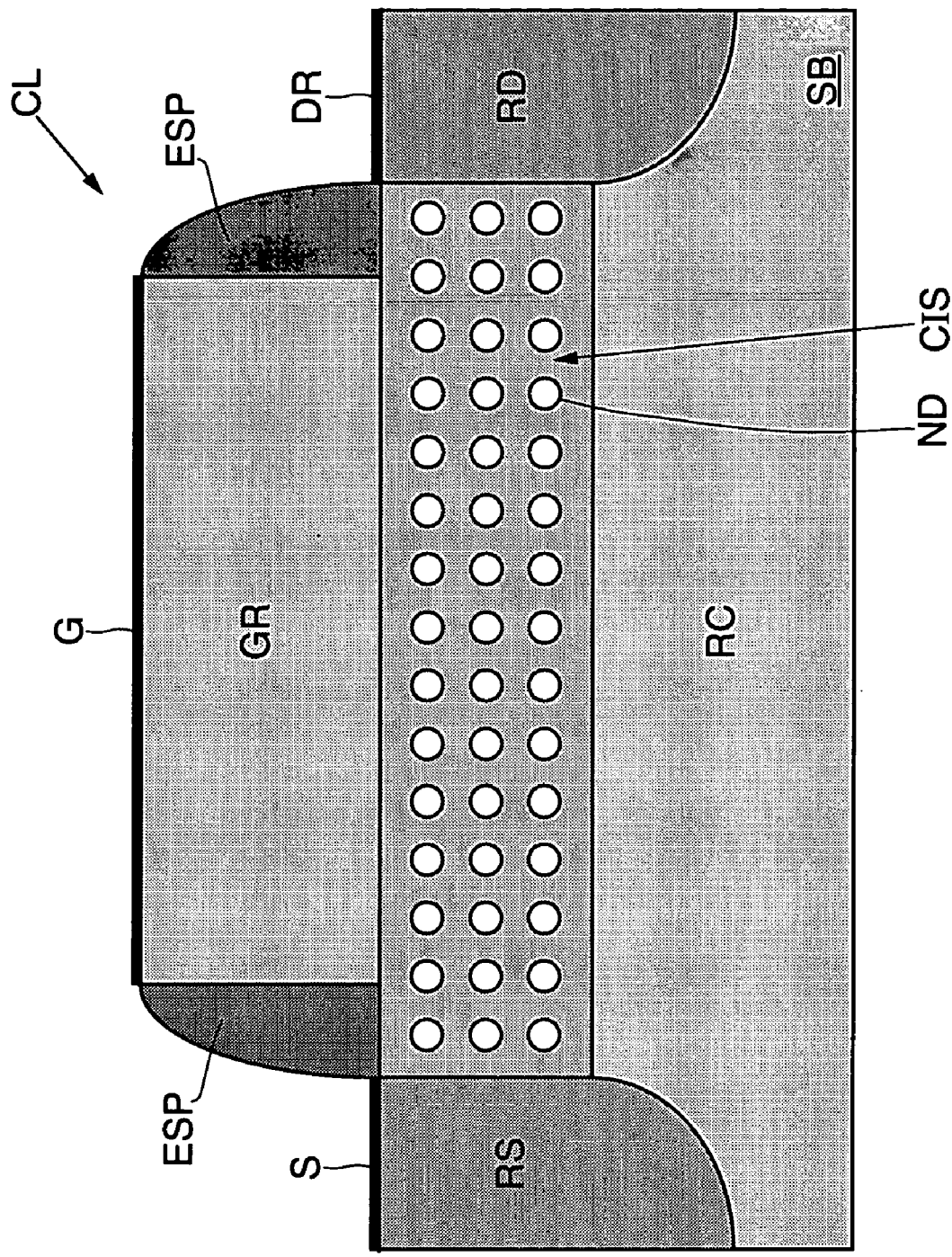
FIG. 7 illustrates another embodiment of a memory cell according to the invention.

Furthermore, although a memory cell containing only a single layer of nodules has just been described, it is conceivable to produce a memory cell containing a plurality of stacked successions of potential wells, as illustrated in FIG. 7, for example a plurality of stacked layers of nodules which are respectively arranged in parallel planes. The operation of such a cell is then the same as that which has just been described, but such a structure makes it possible to amplify the difference between the state "0" and the state "1".

The present invention is not limited to the examples described above. Many alternative embodiments are possible without departing from the scope defined by the appended claims. For example, it should be obvious to those of ordinary skill in the art in view of the present discussion that alternative embodiments of the new and novel memory circuit may be implemented in an integrated circuit comprising a circuit supporting substrate that supports at least a portion of the new and novel memory circuit discussed above. Additionally, the new and novel integrated circuit may be implemented in a computer system comprising at least one integrated circuit thereby providing the advantages of the present invention to such computer system.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An integrated memory circuit, comprising:
   at least one memory cell formed by a single transistor whose gate has a lower face insulated from a channel region by an insulation layer containing at least one succession of potential wells that are substantially arranged at a distance from the gate and from the channel region in a plane substantially parallel to the lower face of the gate, and wherein these potential wells are for containing an electric charge that is confined in the plane and can be controlled to move in the plane towards at least one of a first confinement region next to the source region and a second confinement region next to the drain region, so as to define two memory states for the cell.

2. The integrated memory circuit according to claim 1, wherein the insulation layer contains a dielectric encapsulation encapsulating nodules that form the potential wells, these nodules being capable of carrying the electric charge.

3. The integrated memory circuit according to claim 2, wherein the nodules are formed by an insulating material, for example silicon nitride.

4. The integrated memory circuit according to claim 2, wherein inter-nodule dielectric material contains silicon dioxide.

5. The integrated memory circuit according to claim 2, further comprising injection means capable of injecting an additional electric charge into the encapsulation so as to charge at least some of the nodules.

6. The integrated memory circuit according to claim 5, wherein the injection means contains biasing means capable of biasing the gate, and wherein the thickness of the part of the insulation layer lying between the potential wells and the gate is different from the thickness of the part of the insulation layer lying between the potential wells and the channel.

7. The integrated memory circuit according to claim 2, wherein the nodules are free of intrinsic electric charge, and further comprising injection means capable of injecting the electric charge into the encapsulation so as to charge at least some of the nodules.

8. The integrated memory circuit according to claim 7, wherein the injection means contains biasing means capable of biasing the gate, and wherein the thickness of the part of the insulation layer lying between the potential wells and the gate is different from the thickness of the part of the insulation layer lying between the potential wells and the channel.

9. The integrated memory circuit according to claim 2, wherein the nodules are formed by a crystalline material whose conduction band has a level lower than the level of the conduction band of inter-nodule dielectric material.

10. The integrated memory circuit according to claim 9, wherein the nodules have an intrinsic electric charge.

11. The integrated memory circuit according to claim 10, wherein the nodules are formed by a semiconductor material, for example silicon or a silicon alloy.

12. The integrated memory circuit according to claim 10, further comprising injection means capable of injecting an additional electric charge into the encapsulation so as to charge at least some of the nodules.

13. The integrated memory circuit according to claim 12, wherein the injection means contains biasing means capable of biasing the gate, and wherein the thickness of the part of the insulation layer lying between the potential wells and the gate is different from the thickness of the part of the insulation layer lying between the potential wells and the channel.

14. The integrated memory circuit according to claim 9, wherein the nodules are free of intrinsic electric charge, and further comprising injection means capable of injecting the electric charge into the encapsulation so as to charge at least some of the nodules.

15. The integrated memory circuit according to claim 14, wherein the injection means contains biasing means capable of biasing the gate, and wherein the thickness of the part of the insulation layer lying between the potential wells and the gate is different from the thickness of the part of the insulation layer lying between the potential wells and the channel.

16. The integrated memory circuit according to claim 14, wherein the nodules are formed by an insulating material, for example silicon nitride.

17. The integrated memory circuit according to claim 14, wherein inter-nodule dielectric material contains silicon dioxide.

18. The integrated memory circuit according to claim 2, wherein the average space between two nodules is less than the average diameter of the nodules, less than the average distance separating the nodules from the lower face of the gate and less than the average distance separating the nodules from the channel region.

19. The integrated memory circuit according to claim 18, wherein the average space between two nodules is between about 0.5 and 3 nanometers.

20. The integrated memory circuit according to claim 2, wherein the length of the channel is less than or equal to 100 nanometers, for example equal to 50 nanometers.

21. The integrated memory circuit according to claim 1, wherein the thickness of the part of the insulation layer lying between the potential wells and the gate is between about 1 nanometer and about 10 nanometers, and wherein the thickness of the part of the insulation layer lying between the potential wells and the channel is between about 1 nanometer and about 10 nanometers.

22. The integrated memory circuit according to claim 1, wherein the source and drain regions are arranged so as to be in capacitive coupling with the potential wells which lie in the vicinity of the ends of the insulation layer, and the integrated memory circuit further comprising biasing means capable of biasing the source and drain regions of the transistor so as to move the electric charge towards at least one of the first confinement region and the second confinement region.

23. The integrated memory circuit according to claim 1, further comprising reading means capable of measuring the drain current for a given gate bias.

24. The integrated memory circuit according to claim 1, wherein the source and drain regions come in contact with the lateral ends of the insulation layer.

25. The integrated memory circuit according to claim 1, wherein the insulation layer contains a plurality of successions of potential wells, respectively arranged in separate planes, all substantially parallel to the lower face of the gate.

26. The integrated memory circuit according to claim 1, further comprising a memory plane formed by a plurality of memory cells, each memory cell being addressable individually.

* * * * *